United States Patent [19]

Koyama

[11] Patent Number: 5,291,440

[45] Date of Patent: * Mar. 1, 1994

[54] NON-VOLATILE PROGRAMMABLE READ ONLY MEMORY DEVICE HAVING A PLURALITY OF MEMORY CELLS EACH IMPLEMENTED BY A MEMORY TRANSISTOR AND A SWITCHING TRANSISTOR STACKED THEREON

[75] Inventor: Shoji Koyama, Tokyo, Japan

[73] Assignee: NEC Corporation, Tokyo, Japan

[*] Notice: The portion of the term of this patent subsequent to Mar. 2, 2010 has been disclaimed.

[21] Appl. No.: 733,896

[22] Filed: Jul. 25, 1991

[30] Foreign Application Priority Data

Jul. 30, 1990 [JP] Japan .................................. 2-201754

[51] Int. Cl.$^5$ ............................................ G11C 11/40
[52] U.S. Cl. .................. 365/185; 365/189.11; 365/230.06
[58] Field of Search .................. 365/185, 189.11, 218, 365/230.06; 357/23.5

[56] References Cited

U.S. PATENT DOCUMENTS

| | | | |
|---|---|---|---|
| 4,630,089 | 12/1986 | Sasaki et al. | 357/23.7 |
| 4,633,438 | 12/1986 | Kume et al. | 365/51 |
| 4,667,217 | 5/1987 | Janning | 357/54 |
| 5,060,034 | 10/1991 | Shimizu et al. | 357/23.5 |
| 5,191,551 | 3/1993 | Inoue | 365/189.11 |

FOREIGN PATENT DOCUMENTS

| | | |
|---|---|---|
| 0419663 | 4/1991 | European Pat. Off. . |
| 58-87876 | 5/1983 | Japan . |
| 62-206881 | 9/1987 | Japan . |
| 62-265768 | 11/1987 | Japan . |
| 297056 | 4/1990 | Japan . |
| WO9004855 | 5/1990 | PCT Int'l Appl. . |

Primary Examiner—Eugene R. LaRoche
Assistant Examiner—Viet Q. Nguyen
Attorney, Agent, or Firm—Leydig, Voit & Mayer

[57] ABSTRACT

An electrically erasable and programmable read only memory device includes a plurality of series combinations of memory cells arranged in rows and columns, bit lines, a plurality of word lines, and a source line. Each bit line of the plurality of bit lines is respectively coupled to a front memory cell of the series combinations in one of the columns. The source line is coupled to rearmost memory cells of the plurality of series combinations of each of the columns. Each of the word lines is respectively coupled to each row of the memory cells. Each of the memory cells is implemented by a parallel combination of a floating gate field effect transistor coupled to a first word line and a switching transistor coupled to a second word line. The device is capable of performing selective write operations and simultaneously erasing the series combination of memory cells. The floating gate field effect transistors are formed on a major surface of a semiconductor substrate. The switching transistors are provided over the floating gate field effect transistor. Thus, the plurality of series combinations occupy a small area of the semiconductor substrate even though each memory cell includes both the switching transistor and the floating gate field effect transistor.

13 Claims, 9 Drawing Sheets

NON-VOLATILE PROGRAMMABLE READ ONLY MEMORY DEVICE HAVING A PLURALITY OF MEMORY CELLS EACH IMPLEMENTED BY A MEMORY TRANSISTOR AND A SWITCHING TRANSISTOR STACKED THEREON

FIELD OF THE INVENTION

This invention relates to a non-volatile programmable read only memory device and, more particularly, to the structure of a memory cell incorporated in an electrically erasable and programmable read only memory device.

DESCRIPTION OF THE RELATED ART

Various electrically erasable and programmable read only memory devices are presently available, and a memory cell block implemented by a series combination of floating gate type MOS transistors is usually employed in the prior art electrically erasable and programmable read only memory device. A typical example of the series combination is disclosed by R. Shirota et. al. in Technical Digest of 1988 Symposium on VLSI Technology, pages 33 and 34. FIG. 1 illustrates prior art memory blocks MB1, MB2, MB3 and MB4 each implemented by a series combination of floating gate type MOS transistors MT1 to MT3, MT4 to MT6, MT7 to MT9 or MT10 to MT12 coupled between a first type switching transistor ST1, ST2, ST3 or ST4 and a second type switching transistor ST5, ST6, ST7 or ST8. All of the first and second switching transistors ST1 to ST8 are of the MOS type. The memory blocks MB1 to MB4 are arranged in matrix, and bit lines Y1 and Y2 are respectively associated with the columns of the matrix. Namely, the bit lines Y1 and Y2 are coupled to the first switching transistors ST1 and ST3 and the first switching transistors ST2 and ST4, respectively, and the second switching transistors ST5 to ST8 are coupled to a source line S. Pairs of first and second controlling lines Z1, Z2, Z3 and Z4 are associated with the rows of the matrix, and the first switching transistors ST1 to ST4 are respectively gated by the associated first controlling lines Z1 and Z3. The second switching transistors ST5 to ST8 are gated by the associated second controlling lines Z2 and Z4, respectively. Word lines X1 to X3 and X4 to X6 are further provided for the rows of the matrix, respectively, and each word line group X1 to X3 or X4 to X6 are coupled to the controlling gate electrodes of the floating gate type MOS transistors located at corresponding positions in the matrix.

All of the memory blocks MB1 to MB4 are similar in layout, and the memory block MB1 is, by way of example, illustrated in FIGS. 2 and 3. A p-type silicon substrate 1 is provided for the prior art electrically erasable and programmable read only memory device, and n-type impurity regions 1a, 1b, 1c, 1d, 1e and 1f are formed in the major surface of the p-type silicon substrate 1 at spacings. First and second gate oxide films 2a and 2b are grown on the major surface, and the first and second controlling lines Z1 and Z2 extend on the first gate oxide films 2a for providing respective gate electrodes of the first and second switching transistors ST1 and ST2. Floating gate electrodes F1 to F3 are formed on the second gate oxide films 2b, and the floating gate electrodes F1 to F3 are overlain by third gate oxide films 2c, respectively. In this instance, the second gate oxide films 2b are as thin as 90 angstroms, and Fowler-Nordheim tunneling current flows across the second gate oxide films 2b for supplying and evacuating electric charges. Therefore, the prior art electrically erasable and programmable read only memory device writes a data bit into and erases the data bit from a floating gate type MOS transistor under the Fowler-Nordheim tunneling phenomenon. The word lines X1 to X3 extend on the third gate oxide films 2c, and an inter-level insulating film 3 covers the first and second controlling lines Z1 and Z2 as well as the word lines X1 to X3. A contact hole 3a is formed in the inter-level insulating film 3 and reaches the n-type impurity region 1a. The bit line Y1 passes through the contact hole 3a, however, the bit line Y1 is deleted from FIG. 2 for the sake of simplicity. Thus, all of the switching transistors ST1 and ST2 and all of the floating gate type MOS transistors M1 to M3 are two-dimensionally arranged on the major surface of the p-type silicon substrate 1.

Description is hereinbelow made on three phases of operation, i.e. an erasing phase, a write-in phase and a read-out phase of operation, focusing upon the memory block MB1. Table 1 shows voltage levels on the bit line Y1, the source line S and the word lines X1 to X3 in the three phases of operation. Assuming now that the prior art electrically erasable and programmable read only memory device enters the erasing phase, all of the floating gate type MOS transistors MT1 to MT12 are simultaneously subjected to an erasing operation. In the memory block MB1, the first and second controlling lines Z1 and Z2 go to 5 volts, and the first and second switching transistors ST1 and ST5 turn on. Then, the series combination of the floating gate MOS transistors MT1 to MT3 is conducted to the bit line Y1 and the source line S, and the bit line Y1 and the source line S remain in the ground voltage level. The word lines X1 to X3 are elevated to 17 volts, and Fowler-Nordheim tunneling phenomenon takes place at the second gate oxide films 2b. Electrons are supplied through the second agate oxide films 2b, and are accumulated in the floating gate electrodes F1 to F3. The threshold level of the floating gate type MOS transistors MT1 to MT3 is simultaneously shifted to a positive high level in the presence of the electrons, and the threshold level of the positive high level is tantamount to an erased state in the prior art electrically erasable and programmable read only memory device.

In the write-in phase of operation, the bit line Y1 and the first controlling line Z1 go up to 20 volts, and the source line S and the second controlling line Z2 remain in the ground voltage level. The first switching transistor ST1 turns on, and the second switching transistor ST5 remains off. The first switching transistor ST1 propagates the extremely high voltage level of 20 volts to the series combination of the floating gate type MOS transistors MT1 to MT3, and the series combination is isolated from the source line S. The word lines X1 to X3 are selectively elevated to the extremely high voltage level of 20 volts depending upon the floating gate type MOS transistor to be written. Namely, if the floating gate type MOS transistor MT1 is selected, no word line is elevated to the extremely high voltage level, and the extremely high voltage level reaches only the drain node of the floating gate type MOS transistor MT1. The electrons accumulated in the floating gate FG1 are evacuated therefrom under the Fowler-Nordheim tunneling phenomenon, and the threshold level is recovered to a positive low voltage level. However, when the floating gate type MOS transistor MT2 is selected, the word line X1 goes up to the extremely high voltage level, and the floating gate type MOS transistor MT1 serves as a transfer gate. Then, the extremely high voltage level of 20 volts reaches the drain node of the floating gate type MOS transistor MT2, and the electrons are evacuated from the floating gate FG2 under the Fowler-Nordheim tunneling phenomenon. Since the word line X1 is in the extremely high voltage level of 20 volts, only weak electric field takes place across the second gate oxide film 2b of the floating gate type MOS transistor MT1, and the floating gate type MOS transistor MT1 is hardly affected by the Fowler-Nordheim tunneling phenomenon. The word line X2 associated with the floating gate type MOS transistor MT2 remains in the ground voltage level, and, for this reason, the extremely high voltage level of 20 volts can not reach the drain node of the floating gate type MOS transistor MT3. This means that the floating gate type MOS transistor MT3 is free from the Fowler-Nordheim tunneling phenomenon. Upon selection of the floating gate type MOS transistor MT3, the word lines X1 and X2 go up to the extremely high voltage level, and the floating gate type MOS transistors MT1 and MT2 serve as transfer gates. In the prior art electrically erasable and programmable read only memory device, the low threshold level due to the evacuated floating gate is equivalent to a write-in state. In a case where the floating gate type MOS transistors MT1 to MT3 are sequentially changed to the write-in state, the write-in operation is carried out from the floating gate type MOS transistor MT3 to the floating gate type MOS transistor MT1, because the sequence prevents floating gate type MOS transistors in the write-in state coupled to another bit line Y2 from variation in threshold level. The reason why the second switching transistor ST5 is kept off is that the second switching transistor ST5 cuts off current from the bit line Y1.

While the prior art electrically erasable and programmable read only memory device is in the read-out phase of operation, the bit line Y1 is supplied with 1 volt, the source line S remains in the ground voltage level, and the first and second controlling lines Z1 and Z2 go up to 5 volts. Then, the series combination of the floating gate type MOS transistors MT1 to MT3 is coupled through the first and second switching transistors ST1 and ST5 to the bit and source lines Y1 and S. The word lines X1 to X3 are selectively elevated to 5 volts depending upon an accessed transistor. Namely, if the floating gate type MOS transistor MT1 is accessed, the word lines X2 and X3 go up to 5 volts, and the floating gate type MOS transistors MT2 and MT3 serve as transfer gates. However, the word line X1 associated to the accessed floating gate type MOS transistor MT1 remains in the ground voltage level, and a conductive channel of the accessed floating gate type MOS transistor MT1 is depending upon the state thereof. If the accessed floating gate type MOS transistor MT1 is in the erased state, no conductive channel takes place, and current from the bit line Y1 is blocked by the floating gate type MOS transistor MT1. However, the floating gate type MOS transistor MT1 in the write-in state allows the current to pass through the memory block MB1. Thus, the state of the accessed floating gate type MOS transistor MT1 affects the voltage level on the bit line Y1, and variation of voltage level is detectable by a read-out circuit (not shown). Thus, the floating gate type MOS transistors not to be accessed serve as transfer gates in the read-out phase of operation, and the threshold level thereof is regulated below 5 volts. If a floating gate type MOS transistor serving as a transfer gate is excessively erased, the threshold level thereof is elevated over 5 volts, and the current is undesirably blocked by the excessively erased floating gate type MOS transistor. This results in error.

TABLE 1

| Phase | Selected Tr. | Y1 | Z1 | X1 | X2 | X3 | Z2 | S |
|---|---|---|---|---|---|---|---|---|
| Erase | All | 0 | 5 | 17 | 17 | 17 | 5 | 0 |
| Write-in | MT1 | 20 | 20 | 0 | 0 | 0 | 0 | 0 |
|  | MT2 | 20 | 20 | 20 | 0 | 0 | 0 | 0 |
|  | MT3 | 20 | 20 | 20 | 20 | 0 | 0 | 0 |
| Read-out | MT1 | 1 | 5 | 0 | 5 | 5 | 5 | 0 |
|  | MT2 | 1 | 5 | 5 | 0 | 5 | 5 | 0 |
|  | MT3 | 1 | 5 | 5 | 5 | 0 | 5 | 0 |

The three phases of operation is hereinbefore focused upon the memory block MB1, however, description is made on four floating gate type MOS transistors MT3, MT6, MT9 and MT12 representative of the four memory blocks MB1 to MB4, respectively. Table 2 shows biased state of the floating gate type MOS transistors in the write-in phase of operation. Since the word lines X3 and X6 are shared between the floating gate type MOS transistors MT3 and MT6 and between the floating gate type MOS transistors MT9 and MT12, respectively, the bit lines Y1 and Y2 are used for selection between floating gate type MOS transistors coupled to a word line. For example, if the floating gate type MOS transistor MT3 is subjected to the write-in operation, the bit line Y1 is elevated to the extremely high voltage level of 20 volts, however, the bit line Y2 is kept in an intermediate voltage level of 10 volts. The extremely high voltage level of 20 volts is propagated to the floating gate type MOS transistor MT3 as described hereinbefore, and the Fowler-Nordheim tunneling phenomenon takes place in the presence of strong electric field across the second gate oxide film 2b. This results in the write-in state. However, relatively weak electric field takes place across the second gate oxide film of the floating gate type MOS transistor MT6 because of the intermediate voltage level of 10 volts, and the Fowler-Nordheim tunneling hardly takes place. This results in that the floating gate type MOS transistor MT6 remains in the erased state under even if the first and second controlling lines Z1 and Z2 and the word lines X1 to X3 are coupled thereto. Although the extremely high voltage level of 20 volts is applied to the word lines X1 and X2, the floating gate type MOS transistors MT4 and MT5 are not changed to the write-in state, because the drain nodes thereof are elevated to 10 volts. The memory blocks MB3 and MB4 are isolated from the bit lines Y1 and Y2 by means of the fist switching transistors ST3 and ST4, and no write-in operation is carried out for the floating gate type MOS transistors MT9 and MT12.

TABLE 2

| Selected Tr. | Y1 | Y2 | Z1 | Z2 | Z3 | Z4 | X3 | X6 |
|---|---|---|---|---|---|---|---|---|
| MT3 | 20 | 10 | 20 | 0 | 0 | 0 | 0 | 0 |
| MT6 | 10 | 20 | 20 | 0 | 0 | 0 | 0 | 0 |
| MT9 | 20 | 10 | 0 | 0 | 20 | 0 | 0 | 0 |
| MT12 | 10 | 20 | 0 | 0 | 20 | 0 | 0 | 0 |

As will be understood from the forgoing description, the intermediate voltage level of 10 volts prevents the non-selected floating gate type MOS transistors from unintentional write-in state, and is indispensable for the prior art electrically erasable and programmable read only memory device.

However, the prior art electrically erasable and programmable read only memory device encounters various problems. First, the prior art electrically erasable and programmable read only memory device needs a voltage source for producing the intermediate voltage level, and the peripheral circuit tends to be large.

Second, it is necessary to regulate the intermediate voltage level to a narrow range in which the Fowler-Nordheim tunneling phenomenon does not take place in the presence of ground voltage level and further of the extremely high voltage level. If the intermediate voltage level is out of the narrow range, undesirable write-in state unintentionally takes place in a floating gate type MOS transistor of another memory block in the same row.

Third, read-out error is much liable to take place due to the excessively erased state. The erased state corresponds to the positive high voltage level, however, a floating gate type MOS transistor in the erased state is expected to turn on when serving as a transfer gate in the read-out phase. However, if the floating gate type MOS transistor is excessively erased, the threshold level thereof becomes too high to turn on in the presence of 5 volts on the associated word line. The current passing through the memory block is cut off regardless of the state of the accessed floating gate type MOS transistor, and the voltage level on the associated bit line does not represent the state of the accessed floating gate type MOS transistor. If one of the floating gate type MOS transistors has large possibility of the excessively erased state, the prior art electrically erasable and programmable read only memory device is of inferior product, and, accordingly, the prior art electrically erasable and programmable read only memory device suffers from low yield.

Fourth, the Fowler-Nordheim tunneling current is used for both erasing and write-in operations, and the Fowler-Nordheim tunneling current takes place only when the second gate oxide film is less than 100 angstroms. Pin holes or other defects are much liable to be produced in such an extremely thin second gate oxide film, and these defects deteriorate the production yield. Moreover, the extremely high voltage level on the bit lines Y1 and Y2 as well as the word lines X1 to X6 requests high-withstand transistors, and the high-withstand transistors make the process sequence complex.

Finally, the write-in sequence starts at the closest floating gate type MOS transistor to the source line, and serially proceeds toward a floating gate type MOS transistor adjacent to the associated bit line so as to prevent the floating gate type MOS transistors from unintentional write-in state. As described hereinbefore, floating gate type MOS transistors between the associated bit line and the selected floating gate type MOS transistor serve as transfer gates, and the intermediate voltage level of 10 volts is supplied to the associated word lines. Difference between the extreme tage level of 20 volts on the bit line and the in voltage level of 10 volts on the associated word not causative the unintentional write-in so far as the difference in voltage level is in a short time period. However, if a consists of a large number of the floating gate MOS transistors coupled in series, the reverse sequence, i.e., staring at the closest floating gate type MOS transistor to the bit line, repeatedly exposes the closest floating gate type MOS transistor to the difference in voltage level. In the write-in sequence, the electrons accumulated in the floating gate are gradually evacuated under the Fowler-Nordheim tunneling phenomenon, and the unintentional erased state is much liable to take place in the closest floating gate type MOS transistor. Thus, the write-in sequence starting at the closest floating gate type MOS transistor to the source line is necessary for the prior art electrically erasable and programmable read only memory device, and the write-in sequence requests the erasing operation previously carried out. This prolongs time period for the write-in operation, and, for this reason, the prior art electrically erasable and programmable read only memory device merely finds a narrow application.

SUMMARY OF THE INVENTION

It is therefore an important object of the present invention to provide a non-volatile programmable read only memory device which is free from the problem inherent in the prior art electrically erasable and programmable read only memory device without sacrifice of an occupation area on a semiconductor chip.

To accomplish these objects, the present invention proposes to implement a memory cell by using a memory transistor and a switching transistor coupled in parallel and stacked on the memory transistor.

In accordance with the present invention, there is provided a non-volatile programmable read only memory device fabricated on a semiconductor substrate comprising a plurality of bit lines, a source line, first word lines, and second word lines respectively paired with the first word lines for forming a plurality of word line pairs. A plurality of memory cells are grouped into a plurality of memory blocks and arranged in rows and columns. The plurality of word line pairs are respectively associated with the rows of the plurality of memory cells. The plurality of bit lines are respectively associated with the columns of the plurality of memory cells. The plurality of memory blocks have respective series combinations of the memory cells coupled between the bit lines and the source line. A plurality of block selecting transistors are respectively coupled between the plurality of bit lines and the plurality of memory blocks and are responsive to block selecting signals for selectively coupling the plurality of memory blocks to the plurality of bit lines.

BRIEF DESCRIPTION OF THE DRAWINGS

The features and advantages of the non-volatile programmable read only memory device according to the present invention will be more clearly understood from the following description taken in conjunction with the accompanying drawings in which.

DESCRIPTION OF THE PREFERRED EMBODIMENTS

First Embodiment

Figure 1:
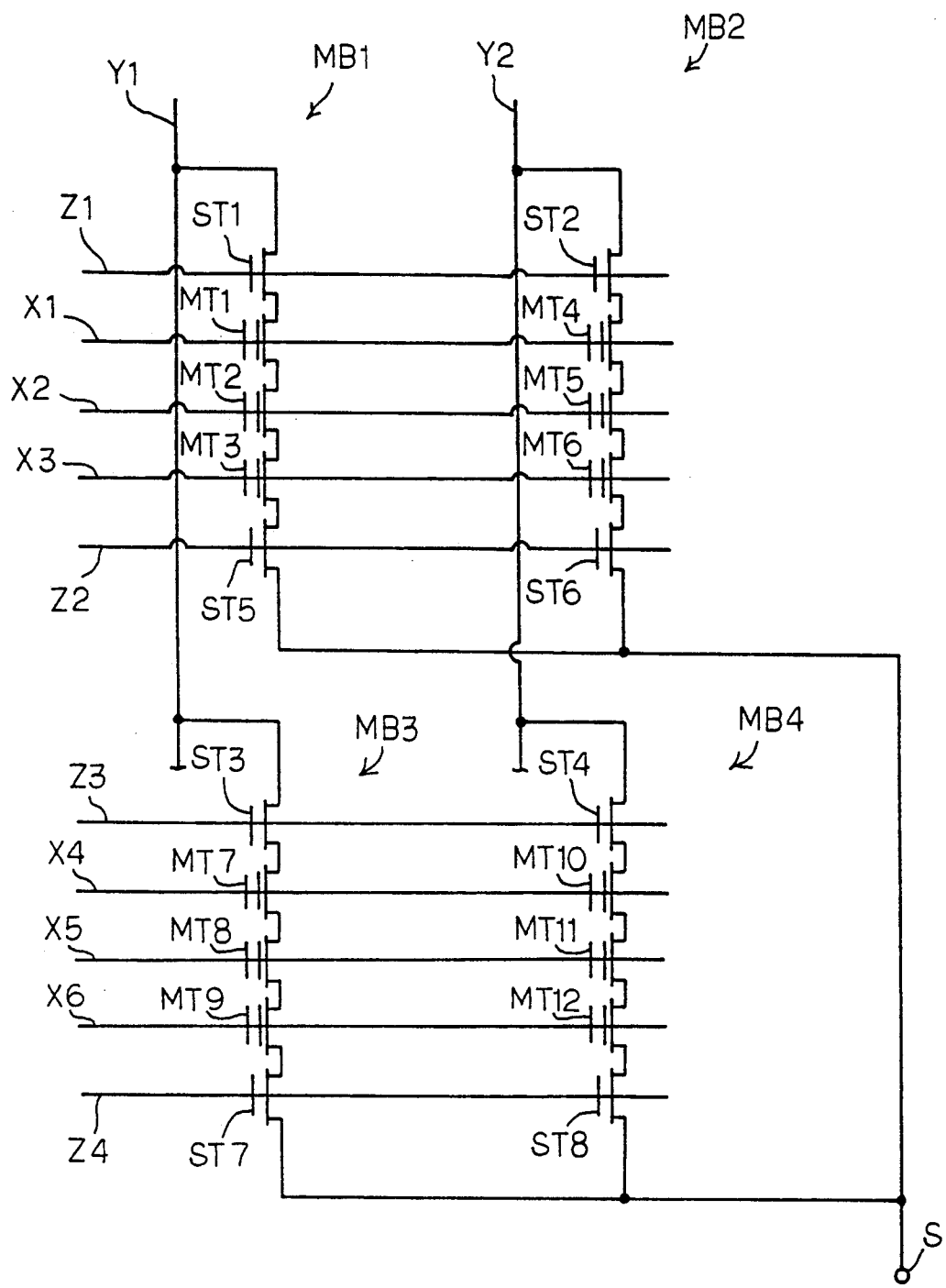
FIG. 1 is a circuit diagram showing the prior art electrically erasable and programmable read only memory device.
Figure 2:
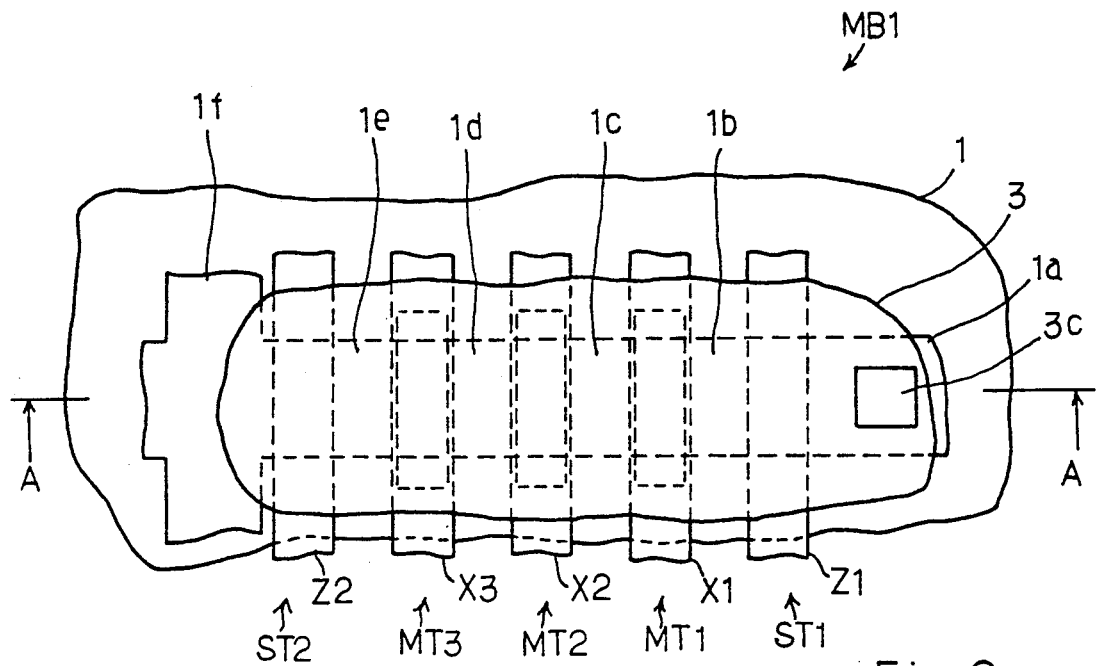
FIG. 2 is a plan view showing the layout of a memory block incorporated in the prior art electrically erasable and programmable read only memory device shown in FIG. 1.
Figure 3:
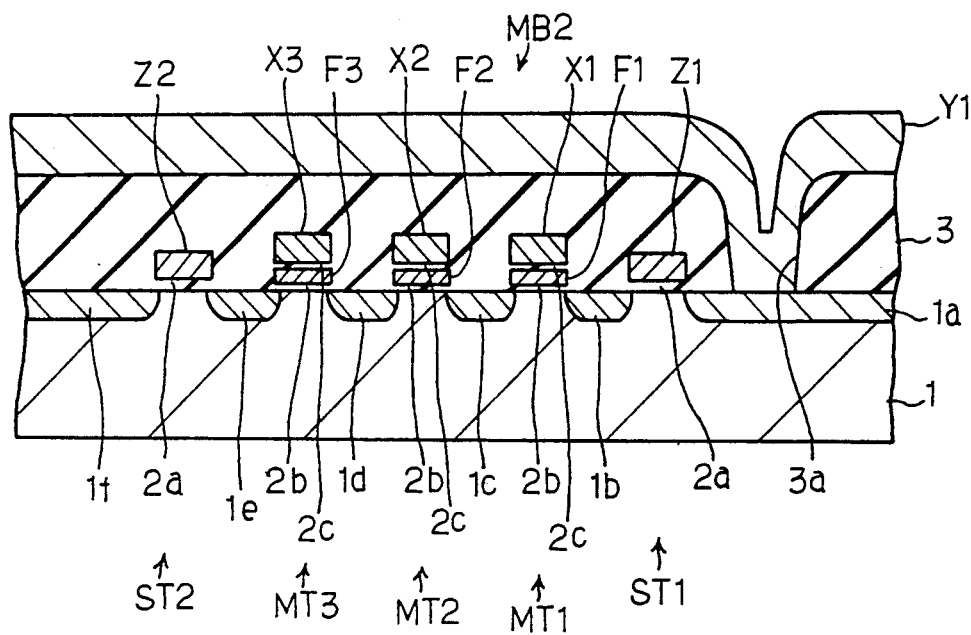
FIG. 3 is a cross sectional view taken along line A—A of FIG. 2 and showing the structure of the memory block.
Figure 4:
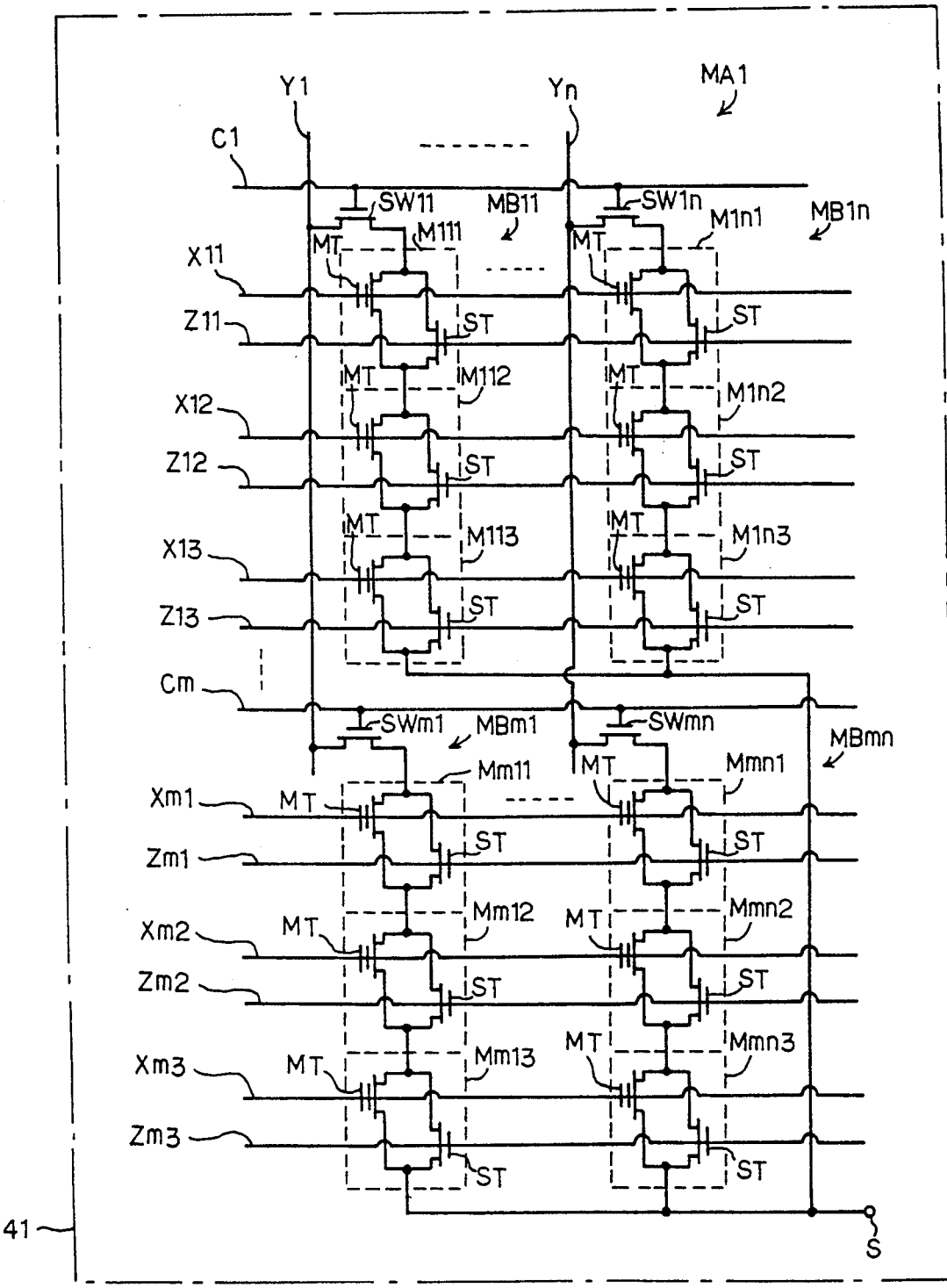
FIG. 4 is a circuit diagram showing the arrangement of a memory cell array incorporated in an electrically erasable and programmable read only memory device according to the present invention.

Referring to FIG. 4 of the drawings, a memory cell incorporated in an electrically erasable and programmable read only memory device embodying the present invention comprises a memory cell array MA1 having a plurality of memory cells M111, M112, M113, M1n1, M1n2, M1n3, Mm11, Mm12, Mm13, Mmn1, Mmn2 and Mmn3. Every three memory cells M111 to M113, M1n1 to M1n3, Mm11 to Mm13 or Mmn1 to Mmn3 form in combination a memory block MB11, MB1n, MBm1 or MBmn, and are coupled in series. Bit lines Y1 to Yn are associated with the columns of the memory cells M111 to Mmn3, respectively, and are coupled to the memory cells M111, M1n1, Mm11 and Mmn1 at the front positions of the memory blocks MB11 to MBmn through n-channel type switching transistors SW11, SW1n, SWm1 and SWmn. A source line S is shared between all of the memory blocks MB11 to MBmn, and is coupled to the memory cells M113, M1n3, Mm13 and Mmn3 at the rearmost positions of the memory blocks MB11 to MBmn. First word lines X11, X12, X13, Xm1, Xm2 and Xm3 are respectively paired with second word lines Z11, Z12, Z13, Zm1, Zm2 and Zm3 to form word line pairs, and the word line pairs are respectively associated with the rows of the memory cells M111 to Mmn3. The switching transistors SW11 to SWmn are gated by controlling lines C1 to Cm, and propagate voltage levels on the associated bit lines to the memory blocks MB11 to MBmn.

Though not shown in the drawings, the memory blocks MB11 to MBmn are fabricated on a lightly doped p-type silicon substrate 41 together with component circuit elements of peripheral circuits. The peripheral circuits may include a row address decoding circuit coupled to the bit lines Y1 to Yn, a column address decoding circuit, a word line driving circuit associated with the column address decoding circuit for selectively driving the first and second word lines X11 to Xm3 and Z11 to Zm3, a plurality of voltage sources for distributing various voltage levels, and a read-out circuit coupled to the bit lines Y1 to Yn for discriminating a state of an accessed memory cell. The read-out circuit may include a sense amplifier circuit.

Each of the memory cells M111 to Mmn3 is implemented by a parallel combination of a memory transistor MT and a switching transistor ST which are gated by the associated first and second word lines, respectively. In this instance, the memory transistor MT is formed by an n-channel floating gate type field effect transistor, and the switching transistor ST is of an n-channel type field effect transistor.

Figure 5:
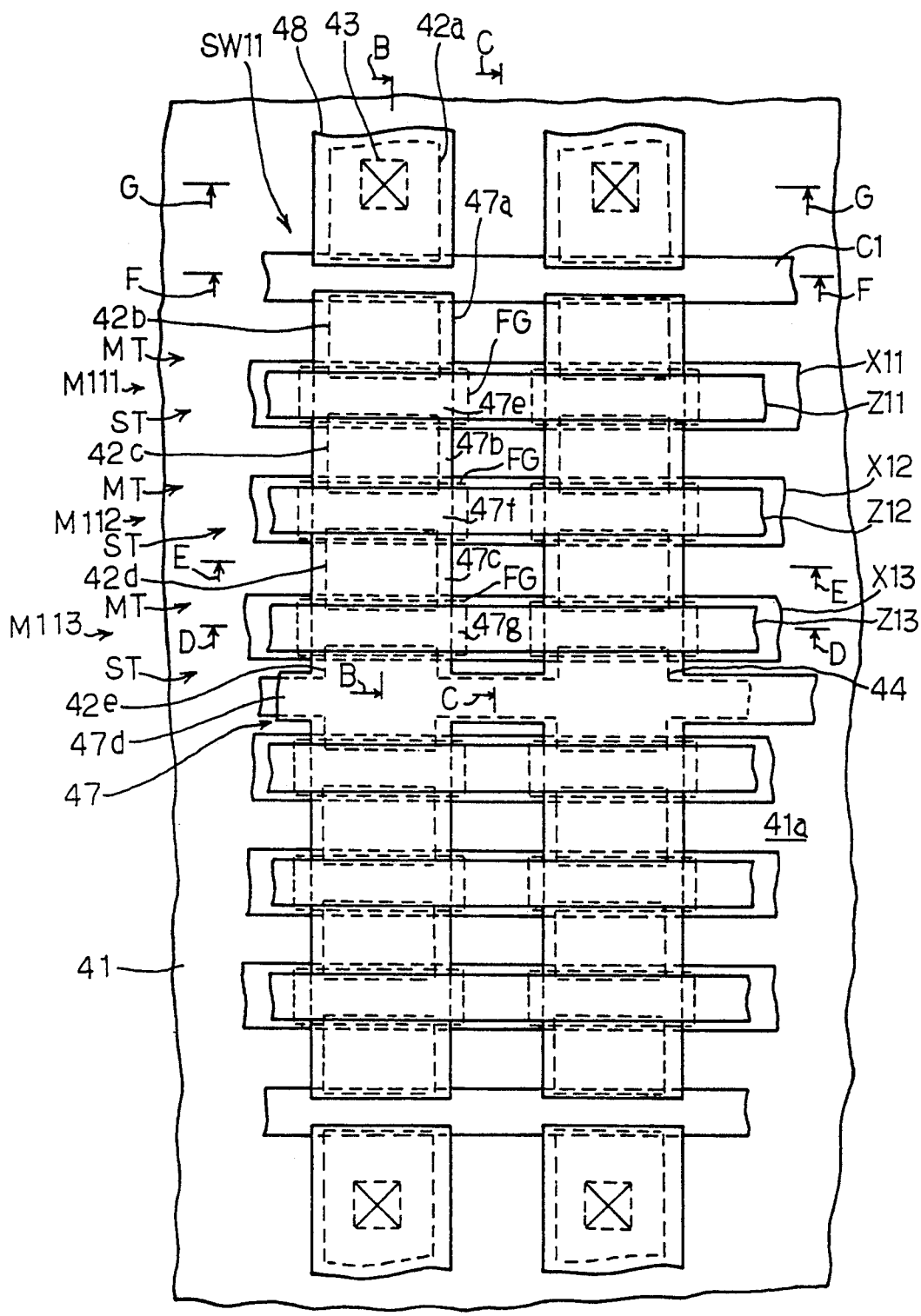
FIG. 5 is a plan view showing the layout of the memory cells incorporated in the electrically erasable and programmable read only memory device shown in FIG. 4.

The layout of a part of the memory cell array MA1 is illustrated in FIG. 5. Although inter-level insulating film structure is provided between conductive wiring strips on different levels, the inter-level insulting film structure is deleted from FIG. 5 for better understanding the arrangement of conductive wiring strips as well as impurity regions. However, the inter-level insulating film structure is retrieved in FIGS. 6 to 11, because the inter-level insulating film structure is important for understanding the structure of the memory cells M111 to Mmn3. FIG. 5 shows four memory blocks, and the four memory blocks are similar in layout to one another. For this reason, only one memory block MB11 located in the upper portion on the left side of FIG. 5 is described in detail.

In the p-type silicon substrate 41 with resistivity of the order of 13 ohm-cm is selectively grown a thick field oxide film 41a which defines a plurality of active areas in the major surface of the p-type silicon substrate 41. In this instance, the thick field oxide film 41a is formed of silicon dioxide and about 6000 angstroms in thickness. N-type impurity regions 42a, 42b, 42c, 42d and 42e are formed in the active areas at spacings, and the n-type impurity regions 42b to 42e serve as source/drain regions of the memory transistors MT. The n-type impurity region 42a is held in contact with the bit line Y1 through a contact hole 43 formed in the inter-level insulating film structure, and the contact hole is marked with "X" for clearly understanding the location. In this instance, the bit line Y1 is formed by an aluminum wiring strip as thick as 1.0 micron. The n-type impurity region 42e further serves as a part of the source line S, and, for this reason, is coupled to n-type impurity regions corresponding thereto such as an n-type impurity region designated by reference numeral 44.

Figure 6:
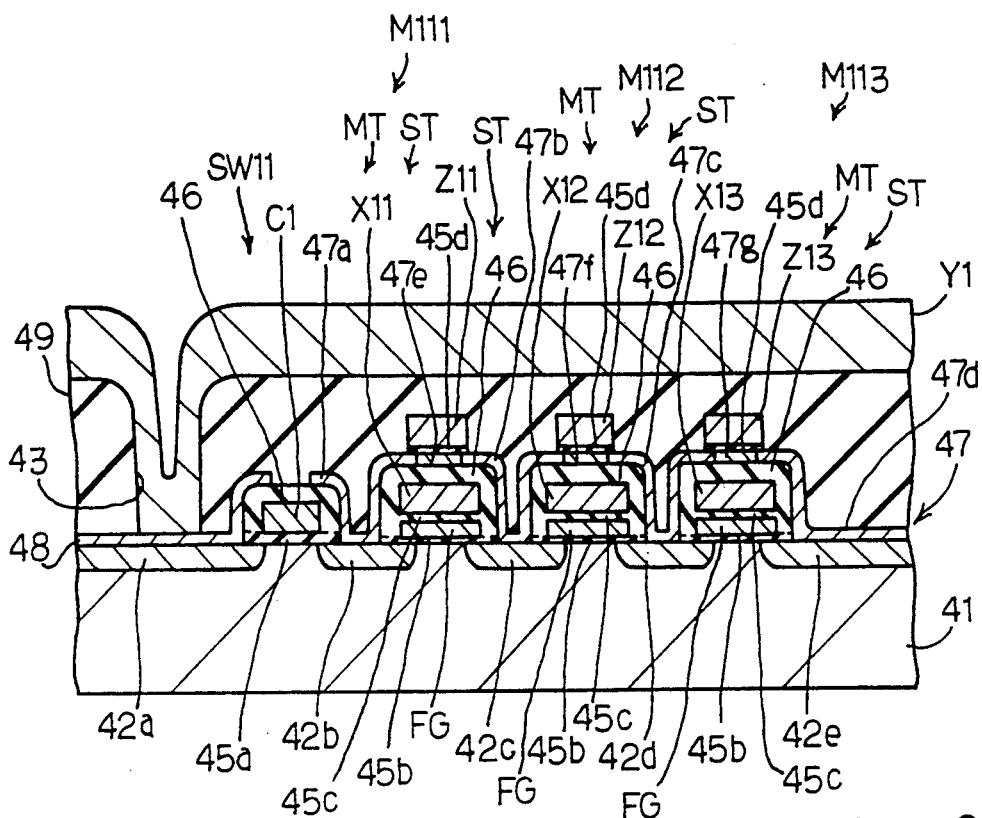
FIG. 6 is a cross sectional view taking along line B—B of FIG. 5 and showing the structure of a memory block.
Figure 7:
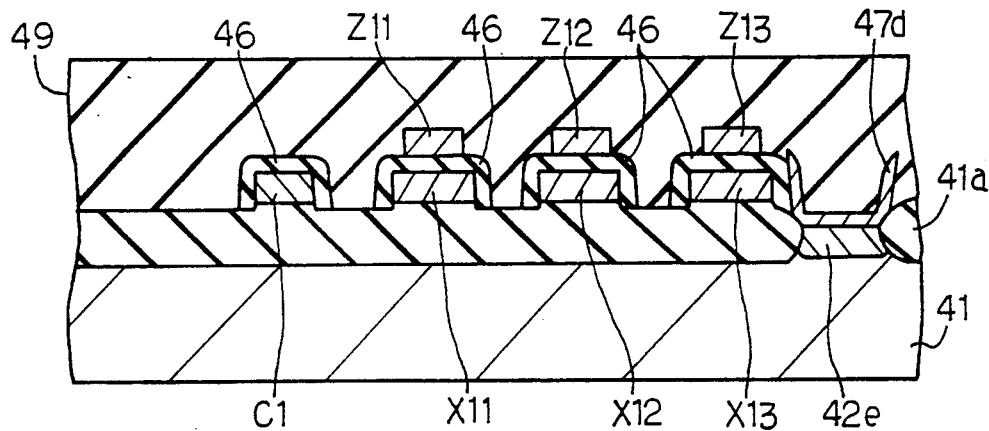
FIG. 7 is a cross sectional view taking along line C—C of FIG. 5 and showing the structure of first and second word lines on a thick field oxide film.
Figure 8:
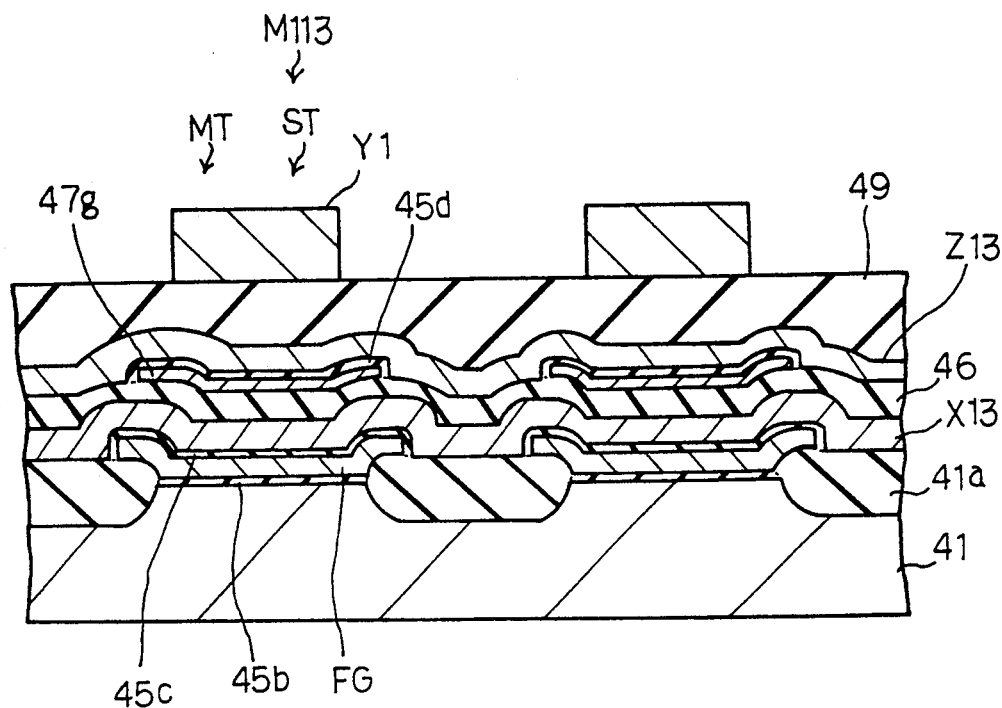
FIG. 8 is a cross sectional view taking along line D—D of FIG. 5 and showing the structure of memory transistors associated with switching transistors.
Figure 9:
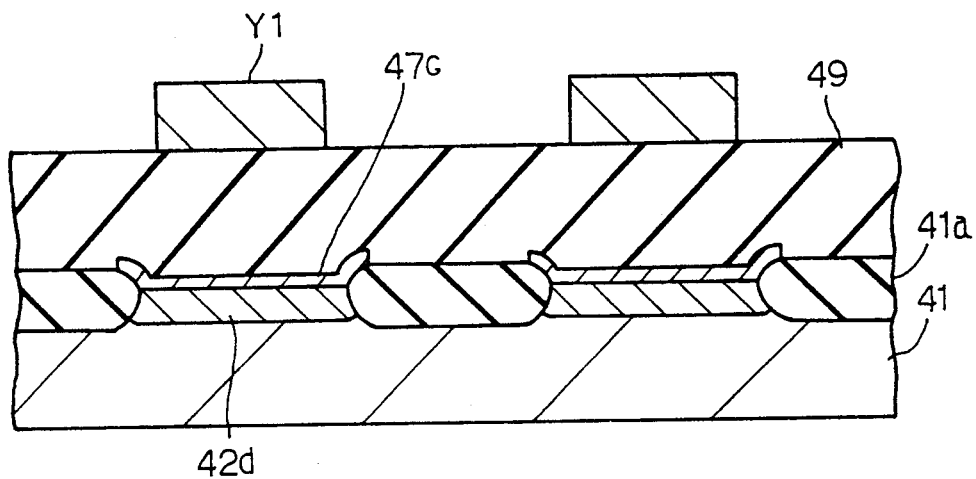
FIG. 9 is a cross sectional view taking along line E—E of FIG. 5 and showing source/drain regions of the memory and switching transistors held in contact with each other.
Figure 10:
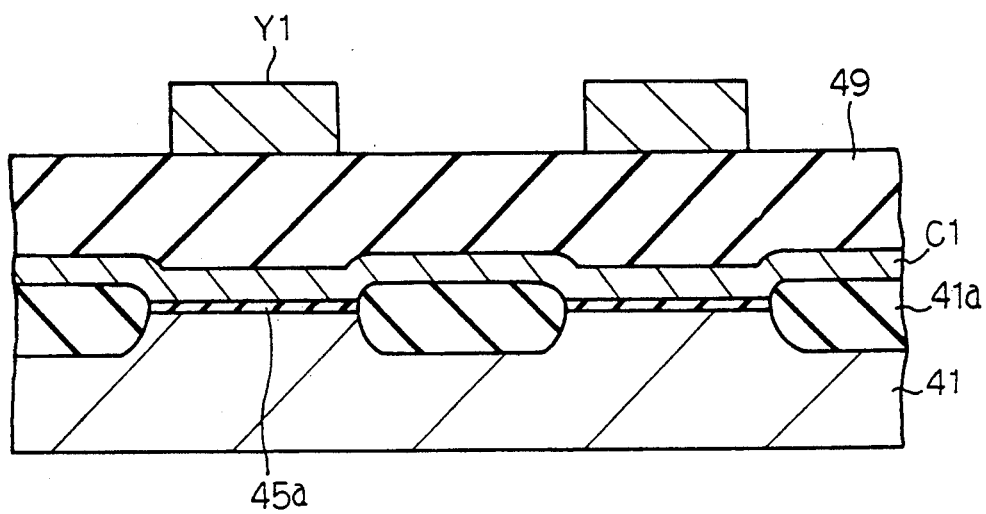
FIG. 10 is a cross sectional view taking along line F—F of FIG. 5 and showing a controlling line of a switching transistor.
Figure 11:
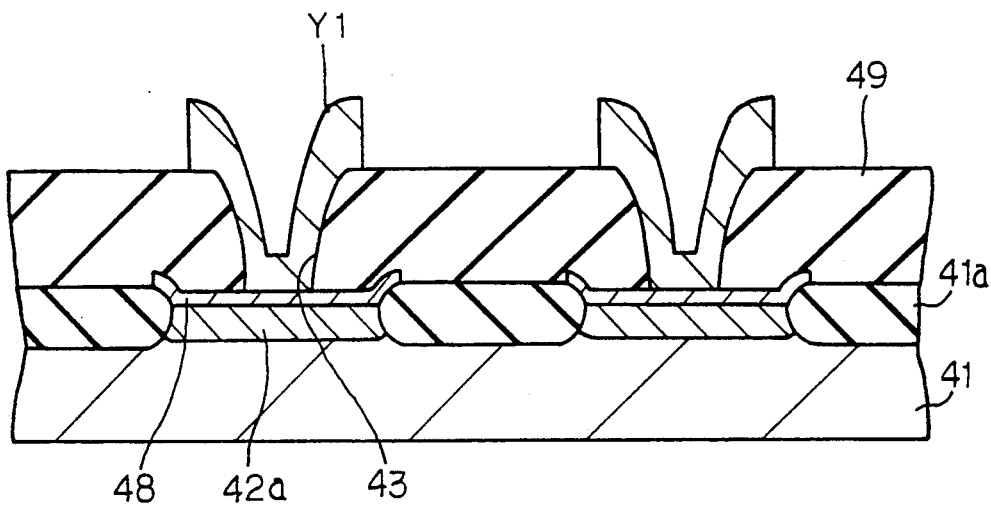
FIG. 11 is a cross sectional view taking along line G—G of FIG. 5 and showing a contact hole formed in an interlevel insulating film structure.

Over that area between the n-type impurity regions 42a and 42b is grown a first gate oxide film 45a of silicon dioxide which is about 300 angstroms in thickness (see FIGS. 6 and 10). The controlling line C1 extends over the first gate oxide film 45a (see FIGS. 6, 7 and 10), and is formed by a p-type polysilicon strip as thick as about 3000 angstroms. The n-type impurity regions 42a and 42b, the first gate oxide film 45a and the controlling line C1 form in combination the switching transistor SW11.

A second gate oxide film 45b of about 120 angstroms is grown over that area between adjacent every two n-type impurity regions 42b to 42f (see FIGS. 6 and 8), and the second gate oxide film 45b is also of silicon dioxide. A floating gate electrode FG is formed on the second gate oxide film 45b (see FIGS. 6 and 8), and is of p-type polysilicon as thick as 200 angstroms. The floating gate electrode FG is overlain by a third gate oxide film 45c of silicon dioxide 45c (see FIGS. 6 and 8), and the third gate oxide film 45c is about 300 angstroms in thickness. The first word lines X11 to X13 respectively pass over the third gate oxide films 45c (see FIGS. 6 to 8). The first word lines X11 to X13 are formed of p-type polysilicon as thick as 3000 angstroms, and provide controlling gate electrodes of the memory transistors MT. The n-type impurity regions 42b to 42e, the second gate oxide films 45b, the floating gate electrodes FG, the third gate oxide films 45c and the first word lines X11 to X13 form in combination the memory transistors MT of the memory cells M111 to M113.

The controlling line C1, the floating gate electrode FG and the first word lines X11 to X13 are covered with a first inter-level insulating film 46 (see FIGS. 6 to 8), and the first inter-level insulating film 46 is of silicon dioxide as thick as 3000 angstroms. A polysilicon strip 47 of about 500 angstroms in thickness is formed on the first inter-level insulating film 46 (see FIG. 6), and is constituted by source/drain regions 47a, 47b, 47c and 47d heavily doped with arsenic (See FIGS. 6 and 9) and channel regions 47e, 47f and 47g each intervening between two source/drain regions 47a to 47d and doped with boron of about $3 \times 10^{16}$ cm$^{-3}$ (see FIGS. 6 and 8).

Another polysilicon strip 48 is held in contact with the n-type impurity region 42a, however, the polysilicon strips 47 and 48 are isolated from each other. The source/drain regions 47a to 47d are held in contact with the n-type impurity regions 42b to 42e, respectively, and are isolated from each other by the channel regions 47e to 47g. The channel regions 47e to 47g are respectively covered with fourth gate oxide films 45d of silicon dioxide as thin as 300 angstroms (see FIGS. 6 and 8), and the second word lines Z11 to Z13 respectively extend over the fourth gate oxide films 45d (see FIGS. 6 to 8). The second word lines Z11 to Z13 are formed of p-type polysilicon of about 3000 angstroms in thickness. The source/drain regions 47b to 47d, the channel regions 47e to 47g, the fourth gate oxide films 45d and the second word lines Z11 to Z13 as a whole constitute the series combination of the switching transistors ST of the memory block MB11. As will be understood from FIGS. 5 to 11, the switching transistors ST are implemented by thin film transistors provided over the associated memory transistors MT, and, for this reason, the amount of area occupied by each memory cell is not increased even if the memory cell is implemented by the parallel combination of the memory transistor MT and the switching transistor ST.

The switching transistors SW11 and ST are covered with a second inter-level insulating film 49, and the second inter-level insulating film 49 is formed of borophosphosilicate glass as thick as 1.0 micron. The first and second inter-level insulating films 46 and 49 form parts of the inter-level insulating film structure.

Figure 12:
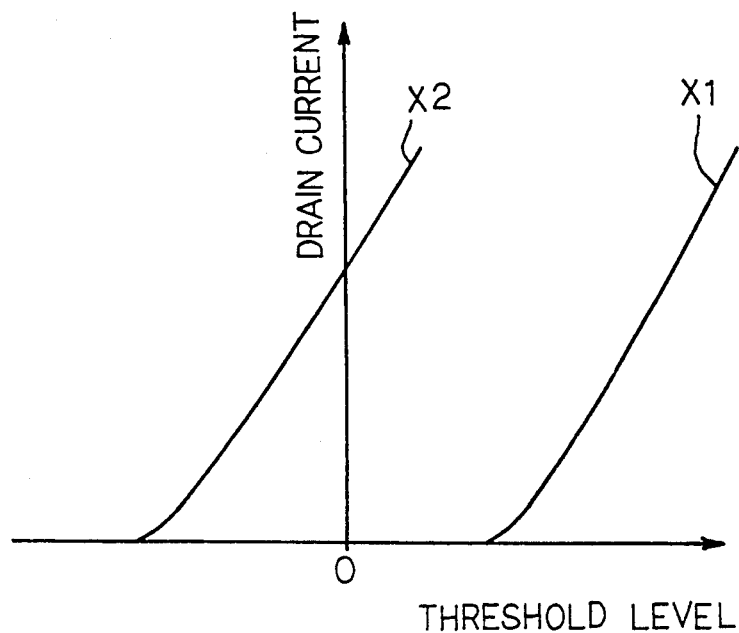
FIG. 12 is a graph showing drain current in terms of threshold level of the memory transistor.
Figure 13:
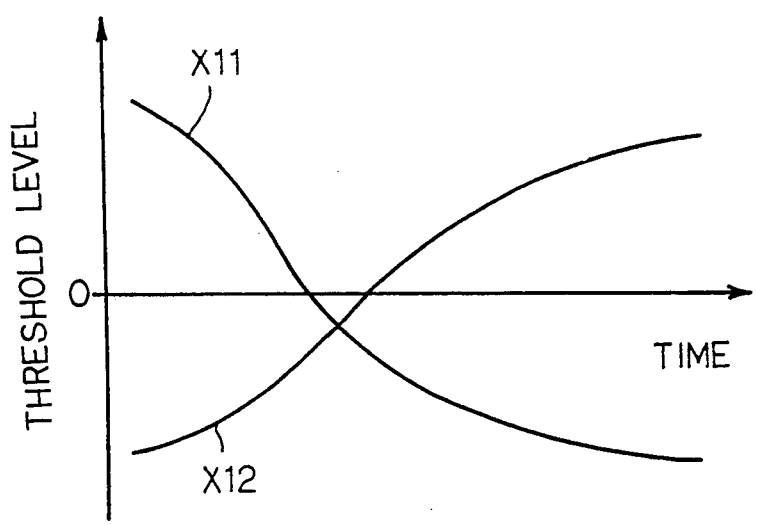
FIG. 13 is a graph showing aged deterioration of the threshold levels in the erased and write-in states.

Description is hereinbelow made on three phases of operation, i.e., an erasing phase, a write-in phase and a read-out phase of operation. In this instance, a write-in state of a memory cell corresponds to a high threshold level created by electrons injected into the floating gate electrode FG, and the memory transistor MT in the write-in state does not turn on in the presence of a read-out voltage level of zero on the associated first word line. On the other hand, an erased state means a low threshold level upon evacuation of the injected electrons, and, accordingly, turns on in the presence of the read-out voltage level on the associated first word line. Therefore, the memory transistor MT traces plots X1 of FIG. 12 in the write-in state and plots X2 in the erased state. The threshold levels are gradually varied during a long service time, and the aged deterioration is illustrated in FIG. 13. The threshold level in the write-in state tends to be decreased as indicated by plots X11, however, the threshold level in the erased state is gradually increased as indicated by plots X12.

The write-in phase of operation is summarized in Table 3. The first column is indicative of a memory cell selected for the write-in operation, and the other columns stand for the bit lines Y1 and Yn, the source line S, the first and second word lines X11 to X13, Xm2, Z11 to Z13 and Zm2 and the controlling lines C1 and Cm.

TABLE 3

| Selected Tr. | (volt) | | | | | | | | | | | | |
|---|---|---|---|---|---|---|---|---|---|---|---|---|---|
| | Y1 | Yn | S | X11 | Z11 | X12 | Z12 | X13 | Z13 | Xm2 | Zm2 | C1 | Cm |
| M111 | 6 | 0 | 0 | 10 | 0 | 0 | 10 | 0 | 10 | 0 | 0 | 10 | 0 |
| M112 | 6 | 0 | 0 | 0 | 10 | 10 | 0 | 0 | 10 | 0 | 0 | 10 | 0 |
| M113 | 6 | 0 | 0 | 0 | 10 | 0 | 10 | 10 | 0 | 0 | 0 | 10 | 0 |
| M1n1 | 0 | 6 | 0 | 10 | 0 | 0 | 10 | 0 | 10 | 0 | 0 | 10 | 0 |
| Mm12 | 6 | 0 | 0 | 0 | 0 | 0 | 0 | 0 | 0 | 10 | 0 | 0 | 10 |
| Mmn2 | 0 | 6 | 0 | 0 | 0 | 0 | 0 | 0 | 0 | 10 | 0 | 0 | 10 |

In the write-in phase of operation, the controlling line C1 or Cm associated with a selected memory cell goes up to ten volts, and the associated bit line Y1 or Yn is elevated to six volts. Six volts are propagated from the bit line Y1 or Yn through the associated switching transistor to the memory block in which the selected memory cell is incorporated. The first word line X11, X12, X13 or Xm2 associated to the selected memory cell goes up to ten volts, however, the second word line Z11, Z12, Z13 or Zm2 associated to the selected memory cell remains in the ground voltage level. On the contrary, the other first word lines associated to the memory block remain in the ground voltage level, and the other second word lines associated to the memory block are elevated to ten volts. The switching transistors ST between the selected memory cell and the switching transistor turn on and serve as transfer gates so as to propagate six volts to the drain region of the memory transistor MT incorporated in the selected memory cell. The memory transistor MT incorporated in the selected memory cell is further coupled to the source line through the switching transistor ST, and a current path is established between the associated bit line Y1 or Yn and the source line S through the memory transistor MT incorporated in the selected memory cell. Current flows from the bit line Y1 or Yn through the memory transistor MT incorporated in the selected memory cell to the source line S, and hot electrons are produced in the memory transistors MT incorporated in the selected memory cell. The hot electrons are attracted toward the floating gate electrode FG, and are accumulated therein. However, no hot electrons are produced in the other memory transistors MT in the same memory block due to the ground voltage level on the associated first word lines, and, accordingly, the other memory cells remain in the previous states, respectively. However, the ground voltage level is supplied to the other bit line Yn or Y1, the other controlling line Cm or C1 and the other first and second word lines which are not associated with the other memory blocks, and any unintentional write-in state is never established in non-selected memory cells. Although the first and second word lines and the controlling line are shared between the memory blocks in the same row, the bit lines associated with the non-selected memory cells remains in the ground voltage level, and no difference in voltage level takes place between the bit lines and the source line S. For this reason, the non-selected memory cells of the memory blocks in the same row are free from unintentional write-in state. Moreover, since the switching transistors SW11 to SWmn are coupled between the associated bit lines Y1 to Yn and the associated memory blocks MB11 to MBmn, undesirable leakage current passing through non-selected memory cells is effectively blocked, and a high write-in efficiency is achieved.

When the electrically erasable and programmable read only memory device according to the present invention enters the erasing phase of operation, Either associated bit line or source line S is used for the erasing operation, and the erasing operation has a simultaneous erasing mode and a selective erasing mode. In the simultaneous erasing mode, all of the memory cells are forced to the erased state, however, a row of the memory cells coupled to one of the selected first word line are erased in the selective erasing mode. Tables 4 and 5 describe an erasing operation from the bit lines and an erasing operation from the source line S, and the simultaneous erasing mode and the selective erasing mode are respectively abbreviated as "SML" and "WRD".

are elevated to the extremely high voltage level of 20 volts. In the circumstances, strong electric field takes place across the second gate oxide films 45b of the selected memory cells, and the Fowler-nordheim tunneling phenomenon allows the electrons accumulated in the floating gate electrodes FG to be discharged.

If the erasing operation from the source line S is employed in the electrically erasable and programmable read only memory device according to the present invention, the simultaneous mode has no selectivity, and, accordingly, all of the first word lines X11 to Xm3 remain in the ground voltage level. However, all of the second word lines Z11 to Zm3 are elevated to the extremely high voltage level of 20 volts, and the switching transistors ST serve as transfer gates for distributing the extremely high voltage level to all of the memory transistors MT. The controlling lines C1 to Cm causes the switching transistors SW11 to SWmn to turn off, and the bit lines Y1 to Yn are open. The extremely high voltage level of 20 volts thus distributed to all of the memory transistors MT produces strong electric field across the second gate oxide films 45b, and allows the electrons to be evacuated from the floating gate electrodes FG.

In the selective mode using the source line S, only the first word line associated with the selected memory cells remains in the ground voltage level, and the other first word lines as well as all of the second word lines Z11 to Zm3 are elevated to the extremely high voltage level of 20 volts. In this situation, strong electric field takes place across the second gate oxide films 45b of the selected memory cells only, and the electrons are evacuated from the floating gate electrodes FG. However, since the first word lines associated with the non-selected memory cells are elevated to the extremely high voltage level of 20 volts, any strong electric field is not produced across the second gate oxide films 45b of the non-selected memory cells, and the non-selected memory cells remain in the previous states, respec-

TABLE 4

| Mode | Select | X11 | X12 | X13 | Xm1 to Xm3 (volt) | Z11 to Zm3 | Y1 | Yn | S | C1 | Cm |
|---|---|---|---|---|---|---|---|---|---|---|---|
| SML | All | 0 | 0 | 0 | 0 | 20 | Open | | 20 | 0 | 0 |
| W | X11 | 0 | 20 | 20 | 20 | 20 | Open | | 20 | 0 | 0 |
| R | X12 | 20 | 0 | 20 | 20 | 20 | Open | | 20 | 0 | 0 |
| D | X13 | 20 | 20 | 0 | 20 | 20 | Open | | 20 | 0 | 0 |

TABLE 5

| Mode | Select | X11 | X12 | X13 | Xm1 to Xm3 (volt) | Z11 to Zm3 | Y1 | Yn | S | C1 | Cm |
|---|---|---|---|---|---|---|---|---|---|---|---|
| SML | All | 0 | 0 | 0 | 0 | 20 | 20 | 20 | Open | 20 | 20 |
| W | X11 | 0 | 20 | 20 | 20 | 20 | 20 | 20 | | 0 | 0 |
| R | X12 | 20 | 0 | 20 | 20 | 20 | 20 | 20 | | 0 | 0 |
| D | X13 | 20 | 20 | 0 | 20 | 20 | 20 | 20 | | 0 | 0 |

In both modes of the erasing phase of operation, fowler-Nordheim tunneling current is used for evacuation of electrons accumulated in the floating gate electrodes FG. For this reason, an extremely high voltage level of 20 volts is supplied to the source or drain regions of the memory transistors, and the first word line associated with the selected memory cells remains in the ground voltage level. However, the other first word lines as well as all of the second word lines Z11 to Zm3 tively.

If the erasing phase of operation is carried out by using the bit lines Y1 to Yn, the source line S is open, and the bit lines Y1 to Yn go up to the extremely high voltage level of 20 volts. Upon selection of the simultaneous erasing mode, all of the first word lines X11 to Xm3 are kept in the ground voltage level. However, all of the second word lines Z11 to Zm3 are elevated to the extremely high voltage level of 20 volts, and the switching transistors ST serve as transfer gates for distributing the extremely high voltage level to all of the memory transistors MT. The controlling lines C1 to Cm allow the switching transistors SW11 to SWmn to turn on, and the bit lines Y1 to Yn are coupled to all of the memory blocks MB11 to MBmn. Then, the extremely high voltage level of 20 volts are distributed to all of the memory transistors MT, and produces strong electric field across the second gate oxide films 45b of all of the memory transistors MT. The electrons are evacuated from the floating gate electrodes FG under the Fowler-nordheim tunneling phenomenon.

In the selective mode using the bit lines Y1 to Yn, only the first word line associated with the selected memory cells remains in the ground voltage level, and the other first word lines as well as all of the second word lines Z11 to Zm3 are elevated to the extremely high voltage level of 20 volts. In this situation, strong electric field takes place across the second gate oxide films 45b of the selected memory cells only, and the electrons are evacuated from the floating gate electrodes FG. However, since the first word lines associated with the non-selected memory cells are elevated to the extremely high voltage level of 20 volts, any strong electric field is not produced across the second gate oxide films 45b of the non-selected memory cells, and the non-selected memory cells remain in the previous states, respectively.

Table 6 describes the read-out phase of operation. In the read-out phase of operation, the read-out voltage level of 1 volt is supplied to the bit line or lines Y1 to Yn associated with the selected memory cell or cells, and the first and second word lines assoicated with the selected dmemory cell or cells remain in the ground voltage level. The controlling line C1 or Cm allows the asoicated switching transistor to turn on, however, the other second word lines associated with the non-selected memory cells go up to 5 volts. The other first word lines assoicated with the non-selected meory cells either go up to five volts or remain in the ground voltage level. In Table 6, "*" stands for any one of 5 volts and zero volt. If the selected memory cell or cells are in the erased state, the memory transistor or transistors MT have the low threshold level, and the ground voltage level on the associated first word line allows the memory transisotrs MT to turn on. For this reason, a current path or paths are established from the asoicated bit line or bit lines Y1 to Yn through the switching transistors ST and the memory transistors MT of the selected memory cells to the source line S. The read-out circuit or circuits detect the voltage level or levels on the bit line or lines Y1 to Yn, and decide the state or states of the selected memory cell or cells. On the other hand, if the selected memory cell or cells are in the write-in state, the memory transisotr or transistors have the high threshold level, and the read-out voltage level of 1 volt keeps the memory transistor or transsitors MT off. Then, the curent path or paths are blocked by the memory transistor or transistors MT, and the voltage level or levels on the bit line or lines Y1 to Yn are slightly lifted, and the read-out circuit or circuits detect the variation. Additionally, in order to concurrently access to a plurality of memory cells, read-out circuits are respectively provided for the bit lines Y1 to Yn, and independently decide the states of the accessed memory cells. Moreover, the switching transitors SW11 to SWmn accelerate the propagation of the voltage level on the bit lines Y1 to Yn, because the switching transistors SW11 to SWmn cut off the parasitic capacitance coupled to the non-selected memory blocks.

TABLE 6

| | (volt) | | | | | | | | | | | |
|---|---|---|---|---|---|---|---|---|---|---|---|---|
| Selected Cell | Y1 | Yn | S | X11 | Z11 | X12 | Z12 | X13 | Z13 | Xm1 to Xm3 | Zm1 to Zm3 | C1 | C2 |
| M111 | 1 | 0 | 0 | 0 | 0 | * | 5 | * | 5 | 0 | 0 | 5 | 0 |
| M112 | 1 | 0 | 0 | * | 5 | 0 | 0 | * | 5 | 0 | 0 | 5 | 0 |
| M113 | 1 | 0 | 0 | * | 5 | * | 5 | 0 | 0 | 0 | 0 | 5 | 0 |
| M1n1 | 0 | 1 | 0 | 0 | 0 | * | 5 | * | 5 | 0 | 0 | 5 | 0 |
| M111 & M1n1 | 1 | 1 | 0 | 0 | 0 | * | 5 | * | 5 | 0 | 0 | 5 | 0 |

As will be understood from the foregoing description, the memory cells accoridng to the present invention are implemented by the respective parallel combinations of the memory transistors MT and the switching transistors ST, and the memory transistors MT do not serve as transfer gates. This means that unintentional write-in state rarely occurs in the memory transistors, and, accordingly, the memory cells according to the present invention are free from the read-out error. Moreover, Since the switching transistors ST are provided over the assoicated memory transisotrs MT, respectively, the memory cell array MA1 occupies real estate as small as that of the prior art electricaly erasable and programmable read only memory device. In other words, the structure of the memory cell never decreases the integration density of the electrically erasable and programmable read only memory device according to the present invention.

Second Embodiment

Figure 14:
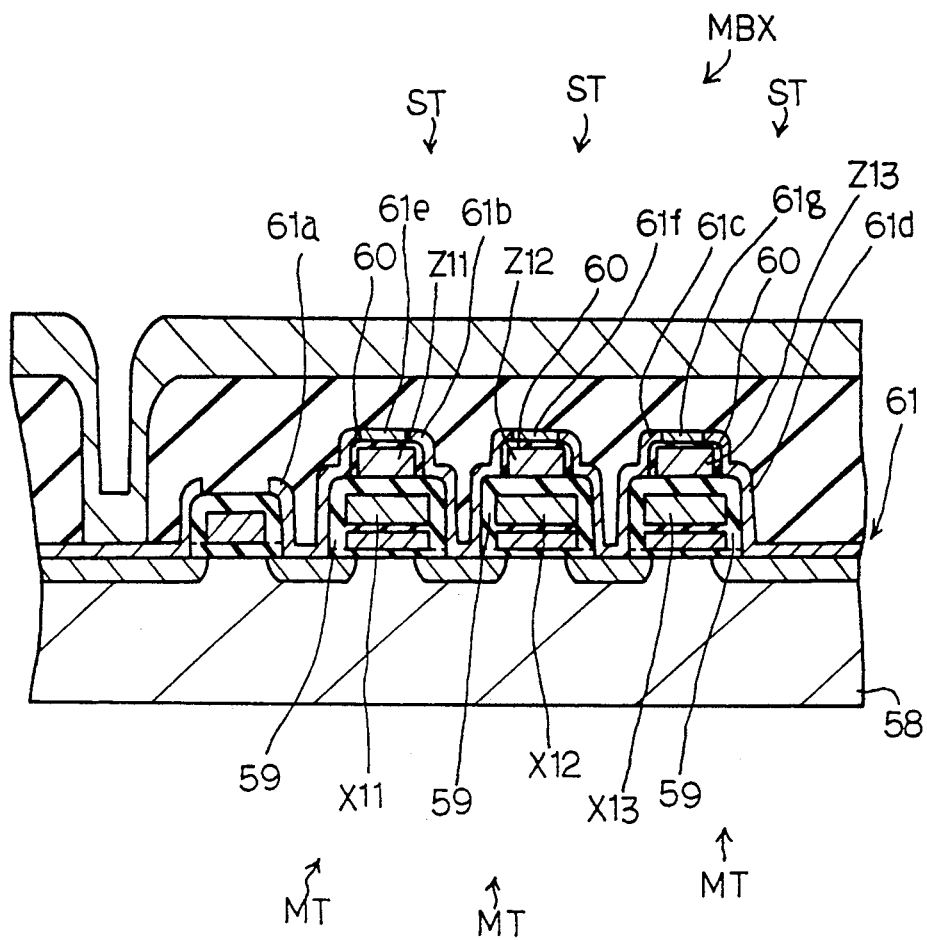
FIG. 14 is a cross sectional view showing the structure of a memory block incorporated in another electrically erasable and programmable read only memory device according to the present invention.

Turning to FIG. 14 of the drawings, the structure of a memory block MBx incorporated in another electrically erasable and programmable read only memory device is illustrated. The memory block MBx is sectioned along a certain virtual plane corresponding to that used in FIG. 6. The electrically erasable and programmable read only memory device is fabricated on a p-type silicon substrate 58, and the memory block MBx is only different from the first embodiment in the structure of the switching transistor. However, the other arrangement and structure are similar to the first embodiment, and no further description is incorporated hereinbelow.

On a first inter-level insulating film 59 extend second word lines Z11 to Z13 which respectively provide gate electrodes of the switching transistors ST. The gate electrodes are covered with gate oxide films 60, respectively, and a polysilicon strip 61 conformally extend along the first inter-level insulating film 59 and the gate oxide films 61. The polysilicon strip 61 is partially doped with n-type impurity atoms for producing n-type source and drain regions 61a to 61d of the switching transistors ST, and p-type channel regions 61e to 61g are produced between the n-type source and drain regions 61a to 61d.

In this instance, the switching transistors ST are respectively provided on the associated memory transistors MT, and the occupation area of memory cell is as small as the first embodiment. Since the second word lines Z11 to Z13 are provided between the first word lines X11 to X13 and the channel regions 61e to 61g, the channel regions 61e to 61g are shielded from electric field due to the first word lines X11 to X13, and the switching transistors ST are stable in operation.

As described hereinbefore, the non-volatile programmable read only memory device according to the present invention is advantageous over the prior art as follows. First, the memory transistors MT do not serve as transfer gates, and any unintentional write-in state and any unintentional erased state never take place. Second, any intermediate voltage level is not necessary, and the source of voltage level is simpler than that of the prior art. Third, the memory cells are free from the excessive write-in state, which corresponds to the excessive erased state in the prior art, and the memory transistors MT have a large margin for the threshold level. This results in a high production yield. Fourth, hot electron junction is available in the write-in phase of operation, and the second gate oxide films are relatively thick rather than that of the prior art. This further enhances the production yield. Fifth, the hot electron injection is carried out under a relatively low write-in voltage level, and unintentional write-in state hardly takes place in non-selected memory cells coupled to the same first word line. The low write-in voltage level allows the nonvolatile programmable read only memory device to decrease high withstand transistors, and this makes the design work and the process sequence simple. The hot electron injection decreases the drain voltage level supplied from the associated bit line, and the unintentional erasing hardly takes place. Sixth, a selective write-in operation is achieved by virtue of the switching transistors ST, and the programming is completed within a relatively short time period. Finally, the memory cell occupies real estate as small as the prior art memory cell. However, any switching transistor between a memory block and a source line is not necessary. Then, the occupation area of the memory cell array is decreased rather than the prior art memory cell array.

Although particular embodiments of the present invention have been shown and described, it will be obvious to those skilled in the art that various changes and modifications may be made without departing from the spirit and scope of the present invention. For example, each memory block may be implemented by a series of more than three memory cells, and the memory transistor MT and the switching transistor ST may be of the p-channel type. Moreover, the present invention is applicable to an electrically programmable read only memory device erasable in radiation of ultra-violet light, and the advantages in the write-in phase as well as the read-out phase are also achieved by the arrangement according to the present invention. In the embodiments described hereinbefore, the Fowler-nordheim tunneling current is used for the erasing operation, however, avalanche break-down may be used for the erasing phase of operation.

What is claimed is:

1. A non-volatile programmable read only memory device fabricated on a semiconductor substrate comprising:
 a plurality of memory cells grouped into a plurality of memory blocks and arranged in rows and columns, each of the plurality of memory blocks including a portion of the plurality of memory cells coupled in series, each of the plurality of memory cells including a parallel connection of a memory transistor disposed on a major surface of the semiconductor substrate and a switching transistor disposed over the memory transistor;
 a plurality of bit lines respectively associated with the columns of the plurality of memory cells, each bit line of the plurality of bit lines being coupled to parallel connections respectively disposed at first ends of memory blocks disposed in an associated column;
 a source coupled to parallel connections respectively disposed at second ends of the plurality of memory blocks;
 a plurality of first word lines respectively associated with the rows of the plurality of memory cells, each of the plurality of first word lines being selectively coupled to controlling gate electrodes of each of the memory transistors; and
 a plurality of second word lines respectively paired with the plurality of first word lines and respectively associated with the rows of the plurality of memory cells, each of the plurality of second word lines being selectively coupled to controlling gate electrodes of each of the switching transistors.

2. A non-volatile programmable read only memory device fabricated on a semiconductor substrate comprising:
 a plurality of memory cells grouped into a plurality of memory blocks and arranged in rows and columns, each of the plurality of memory blocks including a portion of the plurality of memory cells coupled in series, each of the plurality of memory cells including a parallel connection of a memory transistor disposed on a major surface of the semiconductor substrate and a switching transistor disposed over the memory transistor, the memory transistors being covered with a first inter-level insulating film, the switching transistors being thin film transistors provided on said first inter-level insulating film over the memory transistors connected in parallel therewith;
 a plurality of bit lines respectively associated with the columns of the plurality of memory cells, each bit line of the plurality of bit lines being coupled to parallel connections respectively disposed at first ends of memory blocks disposed in an associated column;
 a source line coupled to parallel connections respectively disposed at second ends of the plurality of memory blocks;
 a plurality of first word lines respectively associated with the rows of the plurality of memory cells, each of the plurality of first word lines being selectively coupled to controlling gate electrodes of each of the memory transistors; and
 a plurality of second word lines respectively paired with the plurality of first word lines and respectively associated with the rows of the plurality of memory cells, each of the plurality of second word lines being selectively coupled to controlling gate electrodes of each of the switching transistors.

3. A non-volatile programmable read only memory device as set forth in claims 2 in which each of said memory transistors comprises source and drain regions located in a major surface portion of said semiconductor substrate, a lower gate insulating film covering an area between said source and drain regions, a floating gate electrode located on said lower gate insulating film, an upper gate insulating film located on said floating gate electrode, and a controlling gate electrode being a part of said first word line and disposed on said upper gate insulating film.

4. A non-volatile programmable read only memory device as set forth in claim 3 in which each of said switching transistors comprises a polysilicon strip disposed on said first inter-level insulating film and having source and drain regions and a channel region disposed between said source and drain regions, a gate insulating film covering said channel region, and a gate electrode being a part of said second word line, said channel region substantially overlapping said controlling gate electrode of said memory transistor connected in parallel therewith.

5. A non-volatile programmable read only memory device as set forth in claim 4 in which said source and drain regions of said switching transistor are respectively connected to and in contact with said source and drain regions of said memory transistor.

6. A non-volatile programmable read only memory device as set forth in claim 5 in which said source line is an elongated impurity region disposed within said semiconductor substrate.

7. A non-volatile programmable read only memory device as set forth in claim 6 includes field effect transistors respectively associated with said plurality of memory blocks and coupled between said bit lines and at said first ends of said memory blocks.

8. A non-volatile programmable read only memory device as set forth in claim 7 in which each of said field effect transistors comprises source and drain regions disposed within a major surface portion of said semiconductor substrate, a gate insulating film covering an area between said source and drain regions, and a gate electrode disposed on said gate insulating film, one of said source and drain regions of said field effect transistor being in contact with one of said bit lines through a contact hole located in an inter-level insulating film structure, the other of said source and drain regions of said field effect transistor being in contact with said polysilicon strip.

9. A non-volatile programmable read only memory device as set forth in claim 3 in which each of said switching transistors comprises a gate electrode integral with one of said second word lines and disposed on said first inter-level insulating film, a gate insulating film covering said gate electrode, and a polysilicon strip extending over said gate insulating film and having source and drain regions and a channel region disposed between said source and drain regions, said controlling gate electrode of said memory transistor substantially overlapping a gate electrode of said switching transistor connected in parallel therewith.

10. A non-volatile programmable read only memory device fabricated on a semiconductor substrate comprising:
a plurality of memory cells arranged in rows and columns and including memory transistors and switching transistors, each memory cell of the plurality of memory cells including a parallel connection of one of the memory transistors and one of the switching transistors;
a plurality of bit lines respectively associated with the columns of the plurality of memory cells and selectively connectable with common drain nodes of the memory transistors and the switching transistors;
a source line coupled to the plurality of memory cells and selectively connectable with common source nodes of the memory transistors and the switching transistors;
first word lines respectively associated with the rows of the memory cells and selectively coupled with control gates of the memory transistors; and
second word lines respectively paired with the first word lines and respectively associated with the rows of the memory cells, the second word lines being selectively coupled to gate electrodes of the switching transistors.

11. A non-volatile programmable read only memory device fabricated on a semiconductor substrate comprising:
a plurality of bit lines;
a source line;
first word lines;
second word lines respectively paired with the first word lines for forming a plurality of word line pairs; and
a plurality of memory cells grouped into a plurality of memory blocks and arranged in rows and columns, the plurality of word line pairs being respectively associated with the rows of the plurality of memory cells, the plurality of bit lines being respectively associated with the columns of the plurality of memory cells, and the plurality of memory blocks having respective series combinations of the memory cells coupled between the bit lines and the source line;
a plurality of block selecting transistors respectively coupled between the plurality of bit lines and the plurality of memory blocks and responsive to block selecting signals for selectively coupling the plurality of memory blocks to the plurality of bit lines.

12. A non-volatile programmable read only memory device fabricated on a semiconductor substrate comprising:
a plurality of memory cells arranged in rows and columns and including memory transistors and switching transistors, each memory cell of the plurality of memory cells including a parallel connection of one of the memory transistors and one of the switching transistors, the memory transistors being formed on a major surface of the semiconductor substrate and the switching transistors being respectively provided over the memory transistors respectively connected in parallel therewith;
a plurality of bit lines respectively associated with columns of the plurality of memory cells;
a source line coupled to the plurality of memory cells;
first word lines respectively associated with the rows of the memory cells and coupled to controlling gate electrodes of the memory transistors; and
second word lines respectively paired with the first word lines and respectively associated with the rows of the memory cells, the second word lines being coupled to the switching transistors.

13. A non-volatile programmable read only memory device fabricated on a semiconductor substrate comprising:

a plurality of memory cells grouped into a plurality of memory blocks, arranged in rows and columns, and including memory transistors and switching transistors, the plurality of memory blocks having respective series combinations of the memory cells, each memory cell of the plurality of memory cells including a parallel connection of one of the memory transistors and one of the switching transistors;

a plurality of bit lines respectively associated with columns of the plurality of memory cells;

a plurality of block selecting transistors respectively associated with the plurality of memory blocks and respectively coupled between the plurality of bit lines and parallel connections located at first ends of the plurality of memory blocks, the plurality of block selecting transistors being responsive to block selecting signals for selectively connecting one of the memory blocks to one of the plurality of bit lines;

a source line coupled to parallel connections located at second ends of the plurality of memory blocks;

first word lines respectively associated with the rows of the memory cells and selectively coupled to controlling gate electrodes of the memory transistors; and second word lines respectively paired with the first word lines and respectively associated with the rows of the memory cells, the second word lines being selectively coupled to gate electrodes of the switching transistors, one of the second word lines associated with the one of the rows of memory cells for causing the switching transistors coupled therewith to turn off, the others of the second word lines associated with the one of the rows of memory blocks causing the switching transistors coupled therewith to turn on for allowing the memory transistors associated with the switching transistors in an off-state to couple with the plurality of bit lines, respectively.

* * * * *

UNITED STATES PATENT AND TRADEMARK OFFICE
CERTIFICATE OF CORRECTION

PATENT NO.   : 5,291,440
DATED        : March 1, 1994
INVENTOR(S)  : Shoji Koyama It is certified that error appears in the above-indentified patent and that said Letters Patent is hereby corrected as shown below:

Item [21], change Appl. No.: "733,896" to --735,896--.

Signed and Sealed this

Twenty-seventh Day of September, 1994

Attest:

BRUCE LEHMAN

*Attesting Officer*          *Commissioner of Patents and Trademarks*